(12) United States Patent
Jensen et al.

(10) Patent No.: US 6,373,713 B1
(45) Date of Patent: Apr. 16, 2002

(54) SINGLE HANDLE PRINTED CIRCUIT BOARD ASSEMBLY INSERTION, EXTRACTION, SENSING AND LOCKING MECHANISM

(75) Inventors: Chris J. Jensen, Portland; James D. Pileggi; Stanton A. Tellin, both of Beaverton, all of OR (US)

(73) Assignee: Oresis Communications, Beaverton, OR (US)

( * ) Notice: Subject to any disclaimer, the term of this patent is extended or adjusted under 35 U.S.C. 154(b) by 0 days.

(21) Appl. No.: 09/676,038

(22) Filed: Sep. 28, 2000

(51) Int. Cl.[7] ................................................. H05K 5/00
(52) U.S. Cl. ...................... 361/759; 361/754; 361/798; 361/801; 211/41.17; 439/153; 439/160
(58) Field of Search ................................. 361/726–728, 361/732, 740, 741, 754, 756, 759, 798, 801, 802; 211/411.17; 439/157–160, 372, 153

(56) References Cited

U.S. PATENT DOCUMENTS

| 4,462,499 A | * | 7/1984 | Calabro ................... 211/41.17 |
| 4,564,250 A | * | 1/1986 | Klein et al. ............... 339/14 R |
| 4,614,389 A | * | 9/1986 | Albert et al. ............. 339/45 M |
| 4,778,401 A |   | 10/1988 | Boudreau et al. |
| 4,896,397 A |   | 1/1990 | Elliott |
| 5,006,951 A | * | 4/1991 | Albert et al. ................ 361/720 |
| 5,291,368 A |   | 3/1994 | Conroy-Wass |
| 5,293,303 A | * | 3/1994 | Fletcher et al. ............. 361/798 |
| 5,398,164 A | * | 3/1995 | Goodman et al. .......... 361/752 |
| 5,398,167 A | * | 3/1995 | Joist et al. ................... 361/801 |
| 5,414,594 A | * | 5/1995 | Hristake ..................... 361/755 |
| 5,428,507 A |   | 6/1995 | Chatel et al. |
| 6,185,106 B1 | * | 2/2001 | Mueller ....................... 361/798 |
| 6,266,248 B1 | * | 7/2001 | Hanas et al. ................ 361/752 |

* cited by examiner

Primary Examiner—Jayprakash N. Gandhi
Assistant Examiner—Tuan Dinh
(74) Attorney, Agent, or Firm—Columbia IP Law Group, PC

(57) ABSTRACT

The mechanism for inserting, extracting, sensing and locking a printed circuit board assembly (PCBA) in an electronic system provides both easier use and a longer service life for the PCBA as compared to a mechanism having two locking handles. Insertion, extraction, sensing and locking are simplified because a single handle can be used rather than two handles. The service life of the associated PCBA is extended because the forces applied to the PCBA are synchronous and applied more evenly than a PCBA having two handles, which reduces bending and other forces that can cause component failure.

10 Claims, 3 Drawing Sheets

SINGLE HANDLE PRINTED CIRCUIT BOARD ASSEMBLY INSERTION, EXTRACTION, SENSING AND LOCKING MECHANISM

FIELD OF THE INVENTION

The invention relates to a mechanism for inserting, extracting, sensing and locking a printed circuit board assembly (PCBA) into an electronic system. More specifically, the invention relates to a mechanism having a single handle that provides constant tension on the PCBA.

BACKGROUND OF THE INVENTION

Current PCBA insertion, extraction and locking mechanisms typically have two locking handles at opposite ends of a PCBA, or two handles and a supplementary locking fastener adjacent to the handles. To connect the PCBA to an electronic system, the PCBA is inserted into a slot in a chassis of the electronic system. A technician handles the PCBAs using the two handles. Thus, one disadvantage of current insertion, extraction and locking mechanisms is that a technician is required to use both hands, which prevents the technician from using a hand to perform other functions, for example, hold a flashlight. Additionally, most current mechanisms require a secondary operation to lock the PCBA in place, using one's hand or a screwdriver.

Once the PCBA is inserted in to the chassis of the electronic system, the technician locks the PCBA in place by operating the two handles and actuating a locking mechanism. Because the two handles are operated independently of each other, the forces that are exerted on the PCBA are not consistent and can result in damage to components (e.g., integrated circuits) of the PCBA, or a mating backplane PCBA.

SUMMARY OF THE INVENTION

The mechanism for inserting, extracting, sensing and locking a printed circuit board assembly (PCBA) in an electronic system includes a face plate to receive a printed circuit board assembly (PCBA). A first jaw is pivotably connected to the face plate at a first pivot point and a handle connected to the first jaw. The handle pivots the first jaw about the first pivot point. A second jaw is pivotably connected to the face plate at a second pivot point. A link is connected to the second jaw and to the handle. The link causes the second jaw to pivot about the second pivot point in response to movement of the handle. The first jaw and the second jaw interact with first and second components, respectively, of an electronic system chassis such that action of the first and second jaws causes a substantially constant load to be applied to the face plate and to the PCBA.

BRIEF DESCRIPTION OF THE DRAWINGS

The invention is illustrated by way of example, and not by way of limitation, in the figures of the accompanying drawings in which like reference numerals refer to similar elements.

DETAILED DESCRIPTION

A mechanism for inserting, extracting, sensing and locking a printed circuit board assembly (PCBA) in an electronic system is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The mechanism for inserting, extracting, sensing and locking a PCBA in an electronic system provides both easier use and a longer service life for the PCBA as compared to a mechanism having two locking handles. Insertion, extraction, sensing and locking are simplified because a single handle can be used rather than two handles. The service life of the associated PCBA is extended because the forces applied to the PCBA are synchronous and applied more evenly than a PCBA having two handles, which reduces bending and other forces that can cause component failure.

Figure 1:
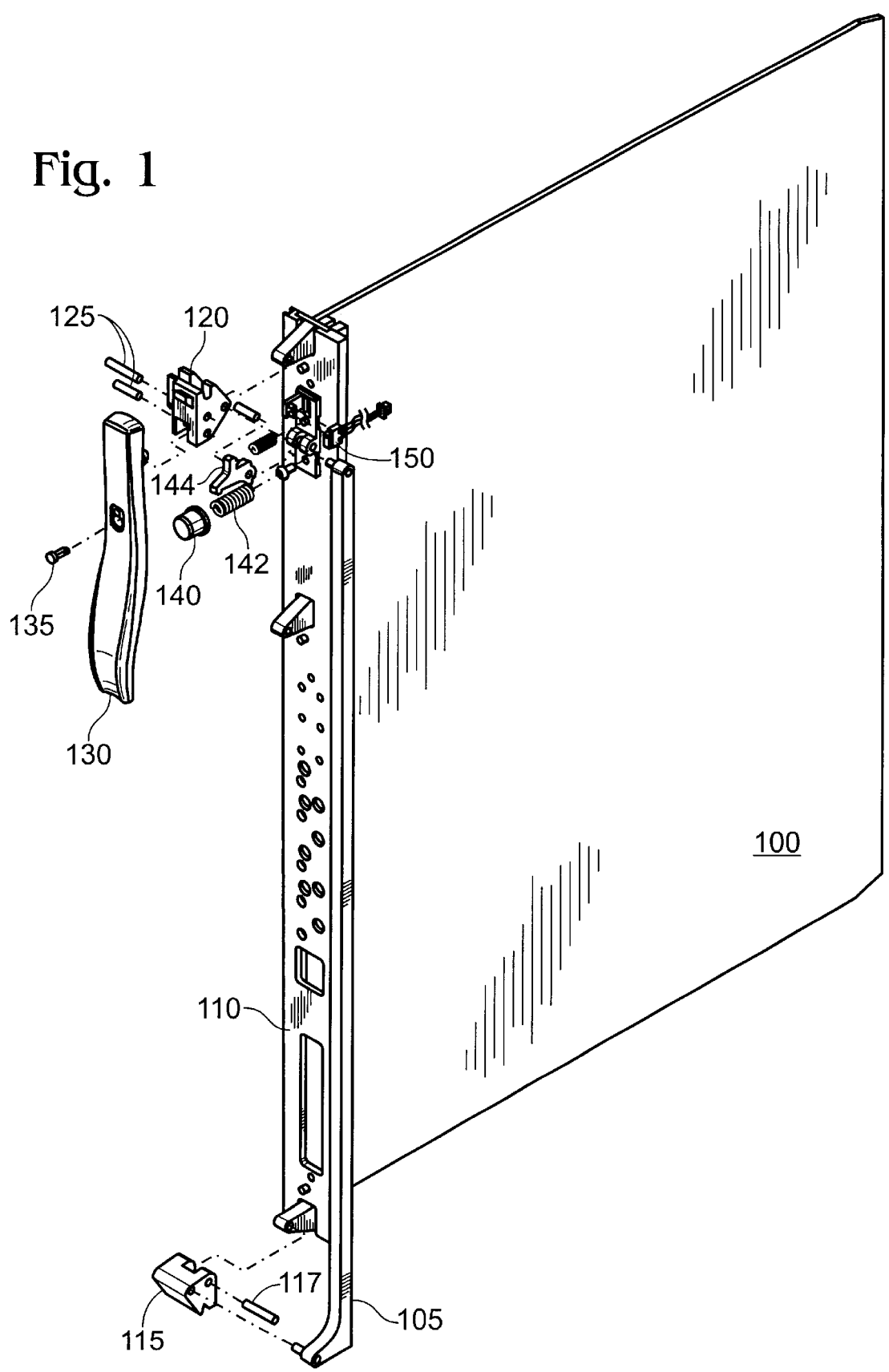
FIG. 1 is an exploded view of one embodiment of a mechanism for inserting, extracting, sensing and locking a printed circuit board assembly (PCBA) in an electronic system.

FIG. 1 is an exploded view of one embodiment of a mechanism for inserting, extracting, sensing and locking a PCBA in an electronic system. PCBA 100 includes electrical components, for example, integrated circuits, resistors, capacitors and/or a slot interface (not shown in FIG. 1) that provide a desired functionality. In one embodiment, PCBA 100 provides functionality for a network switching and/or routing system; however, other systems can be similarly supported.

PCBA 100 is attached to face plate 110. Face plate 110 can be, for example, extruded aluminum. In one embodiment, PCBA 100 is attached to face plate 110 by mounting brackets and screws (not shown in FIG. 1); however, other attachment techniques can also be used. In one embodiment, face plate 110 has holes for access to PCBA 100 or for indicators. For example, PCBA 100 can include a light emitting diode (LED) that indicates when components of PCBA 100 are receiving power. The LED can be aligned with face plate 110 so that the LED can be seen when PCBA 100 is locked into an electronic system. Holes in face plate 110 can also allow signals to be received from an external source, or for other purposes.

In one embodiment, face plate 110 includes electrical interface 150 that provides an interface between PCBA 100 and the handle mechanism of face plate 110. Electrical interface 150 can be used, for example, to cause components to shut down when the handle is raised to remove PCBA 100 from the electrical system in which it is included.

In one embodiment, handle 130, release button 135, pins 125, upper jaw 120, latch pawl 144, spring 142, button 140 and other elements described in greater detail below, allow PCBA 100 to be inserted into, extracted from and locked within an electronic system. In one embodiment, link 105 and pin 117 connect lower jaw 115 to handle 130. The operation of link 105 and pin 117 connect lower jaw 115 with respect to handle 130 is described in greater detail below.

When handle 130 is in a first position, upper jaw 120 and lower jaw 115 are positioned to receive corresponding chassis rails that are part of the electronic system with which PCBA 100 is to be used. When PCBA 100 is inserted into the electronic system and upper jaw 120 and lower jaw 115 are aligned with the chassis rails, handle 130 is moved to a second position and upper jaw 120 and lower jaw 115 lock PCBA 100 in place within the electronic system using the chassis rails as a cam to push PCBA 100 into the electronic system and to lock PCBA 100 in place.

Figure 2:
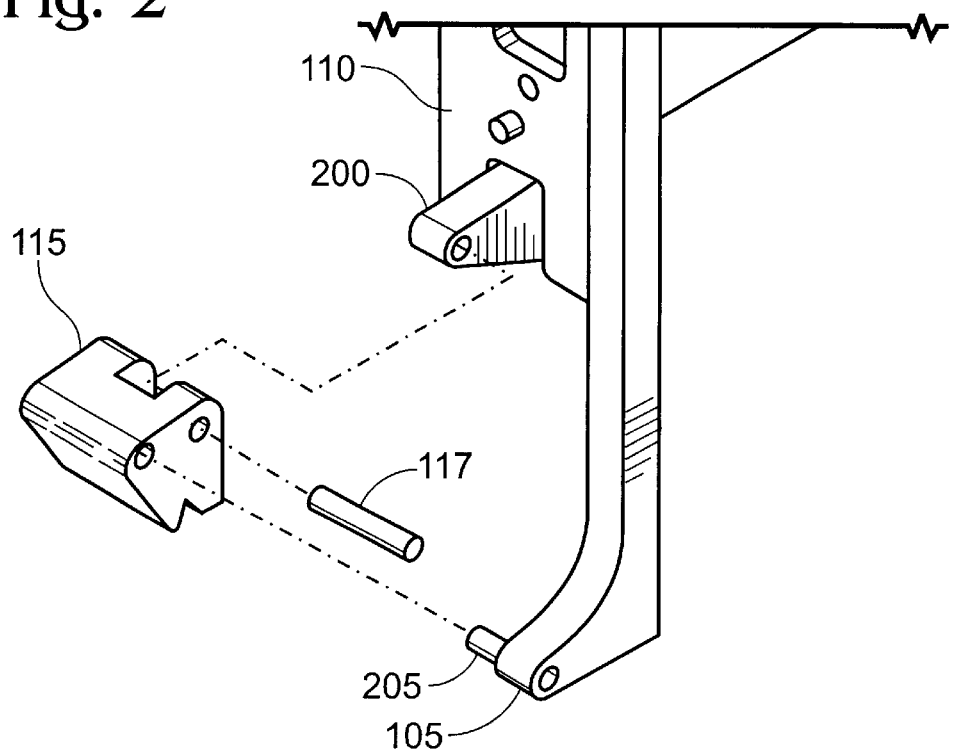
FIG. 2 is an exploded view of one embodiment of a lower assembly of a mechanism for inserting, extracting, sensing and locking a PCBA in an electronic system.

FIG. 2 is an exploded view of one embodiment of a lower assembly of a mechanism for inserting, extracting, sensing and locking a PCBA in an electronic system. In one embodiment, lower jaw 115 is connected to lower pivot mount 200 by pin 117. In one embodiment, lower jaw 115 is nickel plated extruded aluminum; however, other material can also be used. In one embodiment, lower pivot mount 200 is a mini-zinc diecast component that is attached to face plate 110 by a rivet or other suitable technique. Other materials can also be used. In one embodiment, lower jaw 115 is connected to lower pivot mount 200 by pin 117. Pin 117 can be, for example a steel pin, or pin 117 can be made of another suitable material. In one embodiment, pin 117 is 0.125" by 0.750"; however, other dimensions can also be used.

Figure 3:
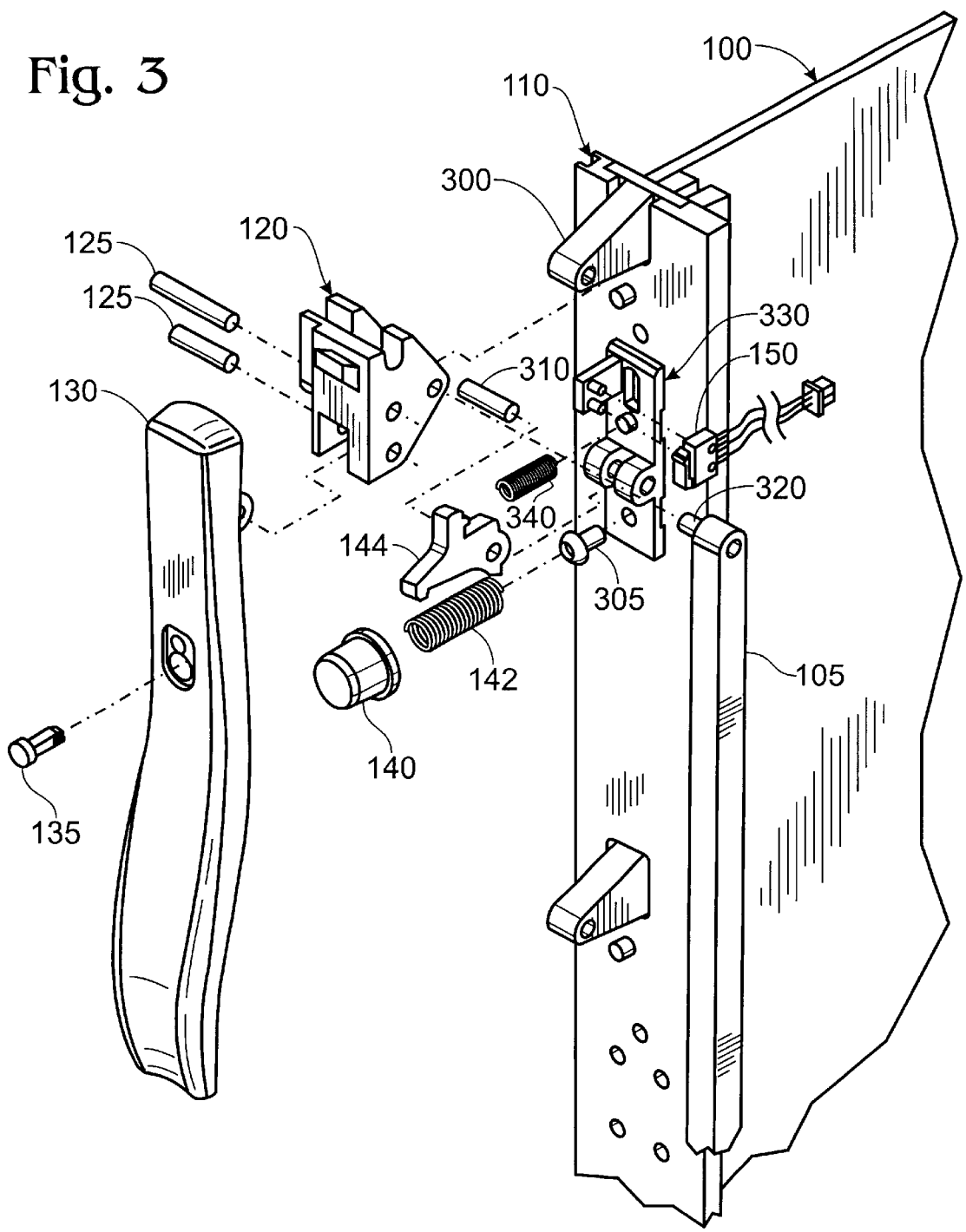
FIG. 3 is an exploded view of one embodiment of an upper assembly of a mechanism for inserting, extracting, sensing and locking a PCBA in an electronic system.

Lower jaw 115 is also connected to link 105, which is also connected to the upper assembly described with respect to FIG. 3. In one embodiment, link 105 is nickel plated A36 hot rolled steel; however, other material can also be used. Link 105 is connected to lower jaw 115 by pin 205. In one embodiment, pin 205 is a 0.125" by 0.450" steel pin; however, other materials and dimensions can also be used.

The elements of FIG. 2 are oriented such that as link 115 is moved by handle 130, lower jaw 115 pivots about pin 117 as positioned by lower pivot mount 200. Lower jaw 115 moves in unison with upper jaw 120 to provide a constant load on face plate 110 and PCBA 100. In one embodiment, the maximum load for insertion and extraction is 175 pounds; however, other maximum loads can also be used.

FIG. 3 is an exploded view of one embodiment of an upper assembly of a mechanism for inserting, extracting, sensing and locking a PCBA in an electronic system. In one embodiment, handle 130 is injection molded, 30% glass filled polyester; however, other materials can also be used. Handle 130 is connected to upper jaw 120 by pins 125. In one embodiment, two pins connect handle 130 to upper jaw 120; however, any appropriate mounting technique known in the art can be used. In one embodiment, pins 125 are steel pins having a 0.125" diameter; however, other materials and sizes can be used.

In one embodiment, upper jaw 120 is nickel plated extruded aluminum; however, other materials can also be used. Upper jaw 120 is connected to upper pivot mount 300 by one of pins 125. In one embodiment, upper pivot mount 300 is a mini-zinc diecast component that is attached to face plate 110 by a rivet or other suitable technique. Other materials can also be used.

Link 105 is connected to upper jaw mount 120 by pin 320. In one embodiment, pin 320 is a steel pin; however, other materials can also be used. The elements of FIG. 3 are oriented such that as link 105 is moved by handle 130, upper jaw 120 pivots about one of pins 125 as positioned by upper pivot mount 300. Upper jaw 120 moves in unison with lower jaw 115 to provide a constant load on face plate 110 and PCBA 100.

In one embodiment, the handle mechanism includes additional components for locking and releasing PCBA 100. Handle/switch holder 330 provides a base for the additional locking and releasing components. In one embodiment handle/switch holder 330 is 10% glass filled nylon; however, other suitable materials can also be used. Handle/switch holder 330 can be attached to face plate 110 by a rivet, for example, rivet 305, or other suitable technique.

Handle/switch holder 330 includes pins, or other attachment points, for electrical interface 150. In one embodiment, electrical interface 150 includes a proximity switch on the external side and a male or female connector on the internal (PCBA) side. When handle 130 is depressed to lock PCBA 100 into an electronic system, proximity switch 150 is closed to provide an electrical indication that PCBA 100 is inserted and locked into the electronic system. When handle 130 is released, the proximity switch is opened to provide an electrical indication that PCBA 100 is, or is to be, removed from the electronic system. The lines of electrical interface 150 can also be soldered, or otherwise connected, to PCBA 100.

Handle/switch holder 330 can also provide a seat for latch/locking spring 340. Latch/locking spring 340 operates with latch pawl 144 to latch handle 130 into a locked position to keep PCBA 100 locked into the electronic system. In one embodiment, latch pawl 144 is made of fine blanked cold rolled steel; however other materials can also be used. Latch pawl 144 is connected to handle/switch holder 330 by pin 310. In one embodiment, pin 310 is made of steel and has dimensions of 0.125" by 0.450; however, other materials and dimensions can also be used.

Latch pawl 144 includes a hook that latches into an opening (not shown in FIG. 3) on the bottom side of handle 130. Latch pawl 144 is maintained in a locking position with handle 130 by latch/locking spring 340. Latch pawl 144 is released by latch release button 135. In one embodiment, latch release button 135 is made of injection molded 10% glass filled nylon; however, other materials can also be used. Release button 135 causes latch/locking spring 340 to further compress, which causes latch pawl 144 to release handle 130.

In one embodiment, handle kick-back spring 142 and handle button 140 force handle 130 away from latch pawl 144 when handle 130 is not latched by latch pawl 144. In one embodiment, handle button 140 is injection molded ABS; however, other materials can also be used. Thus, by depressing latch release button 135, PCBA 100 can be unlocked and removed from the electronic system with one hand.

Figure 4:
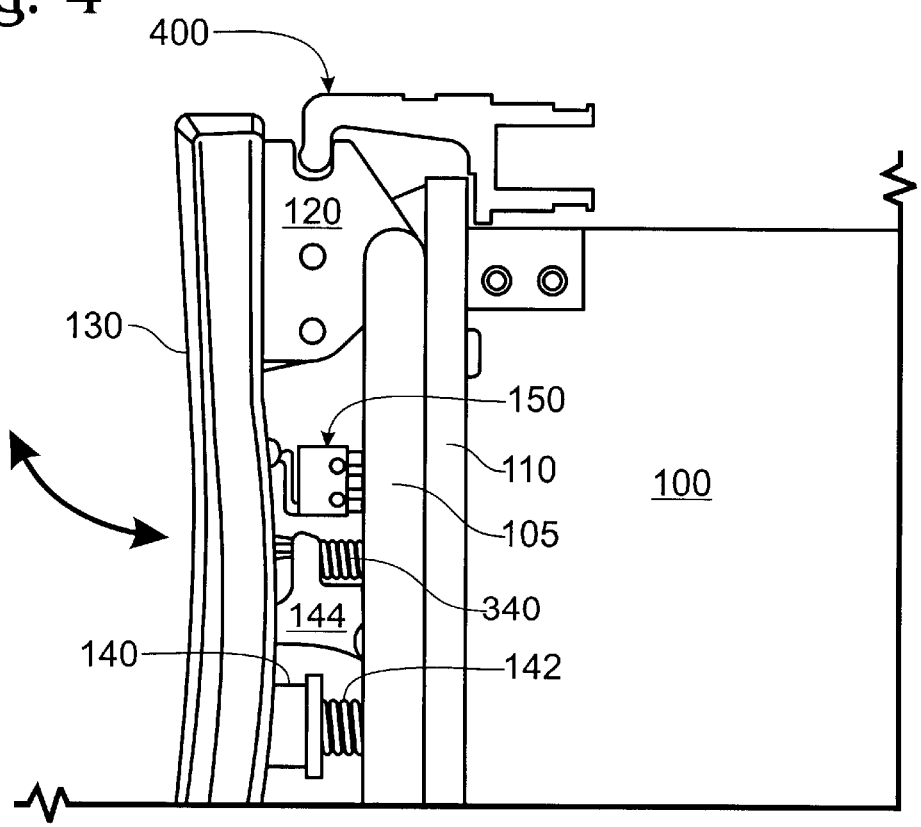
FIG. 4 illustrates a chassis interface for one embodiment of a mechanism for inserting, extracting, sensing and locking a PCBA in an electronic system.

FIG. 4 illustrates a chassis interface for one embodiment of a mechanism for inserting, extracting, sensing and locking a PCBA in an electronic system. FIG. 4 illustrates the upper assembly in the locked position. The lower assembly locks in a similar manner.

As handle 130 is rotated as illustrated by the double-headed arrow in FIG. 4, upper jaw 120 is also rotated. When chassis rail 400 (shown in cross section views) is located within the opening of upper jaw 120 and handle 130 is rotated to the closed and locked position, upper jaw 120 interlocks with chassis rail 400 to force PCBA 100 in to the electronic system. When handle 130 is locked in position by handle pawl 144, PCBA 100 is locked in the electronic system. Lower jaw 115 operates in a similar manner.

To release and remove PCBA 100 from the electronic system, latch release button 135 (not shown in FIG. 4) is depressed to release handle 130 from handle pawl 144. As handle 130 is rotated away from face plate 110, upper jaw 120 rotates, moving relative to chassis rail 400, allowing PCBA 100 to be removed from the electronic system. Lower jaw 115 operates in a similar manner.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. An apparatus comprising:
   a face plate to receive a printed circuit board assembly (PCBA);
   a first jaw pivotably connected to the face plate at a first pivot point;
   a handle connected to the first jaw, the handle to pivot the first jaw about the first pivot point;
   a second jaw pivotably connected to the face plate at a second pivot point; and
   a link connected to the second jaw and to the handle to cause the second jaw to pivot about the second pivot point in response to movement of the handle, the first jaw and the second jaw to interact with first and second railing components, respectively, wherein action of the first and second jaws causes a substantially constant load to be applied to the face plate and to the PCBA.

2. The apparatus of claim 1 further comprising:
   a latch/locking spring connected to the face plate; and
   a latch pawl connected to the face plate, wherein the latch pawl and the latch/locking spring maintain the handle in a locked position to cause the first jaw and the second jaw to apply the substantially constant load to the face plate to maintain the PCBA within the chassis of the electronic system.

3. The apparatus of claim 1 further comprising a kick-back spring connected to the face plate, the kick-back spring to force the handle away from the face plate when the handle is not maintained in a first position by a latch pawl.

4. The apparatus of claim 1 further comprising:
   an electrical switch connected to the face plate, the electrical switch to be held in a first position by the handle and to be released to a second position when not held in the first position by the handle; and
   one or more wires coupled to the electrical switch and to the PCBA, the one or more wires to carry electrical signals between the electrical switch and the PCBA.

5. The apparatus of claim 1 further comprising a latch release button connected to the handle, the latch release button to interact with a latch pawl to release the handle from a first position when the latch release button is depressed.

6. An apparatus comprising:
   a printed circuit board assembly (PCBA);
   a face plate coupled to the PCBA;
   a first jaw pivotably connected to the face plate at a first pivot point;
   a handle connected to the first jaw, the handle to pivot the first jaw about the first pivot point;
   a second jaw pivotably connected to the face plate at a second pivot point; and
   a link connected to the second jaw and to the handle to cause the second jaw to pivot about the second pivot point in response to movement of the handle, the first jaw and the second jaw to interact with first and second railing components, respectively, wherein action of the first and second jaws causes a substantially constant load to be applied to the face plate and to the PCBA.

7. The apparatus of claim 6 further comprising:
   a latch/locking spring connected to the face plate; and
   a latch pawl connected to the face plate, wherein the latch pawl and the latch/locking spring maintain the handle in a locked position to cause the first jaw and the second jaw to apply the substantially constant load to the face plate to maintain the PCBA within the chassis of the electronic system.

8. The apparatus of claim 6 further comprising a kick-back spring connected to the face plate, the kick-back spring to force the handle away from the face plate when the handle is not maintained in a first position by a latch pawl.

9. The apparatus of claim 6 further comprising:
   an electrical switch connected to the face plate, the electrical switch to be held in a first position by the handle and to be released to a second position when not held in the first position by the handle; and
   one or more wires coupled to the electrical switch and to the PCBA, the one or more wires to carry electrical signals between the electrical switch and the PCBA.

10. The apparatus of claim 6 further comprising a latch release button connected to the handle, the latch release button to interact with a latch pawl to release the handle from a first position when the latch release button is depressed.

* * * * *